(12) United States Patent
Suzuki et al.

(10) Patent No.: US 11,121,248 B2
(45) Date of Patent: Sep. 14, 2021

(54) SEMICONDUCTOR DEVICE

(71) Applicant: FUJI ELECTRIC CO., LTD., Kawasaki (JP)

(72) Inventors: Yoshihisa Suzuki, Matsumoto (JP); Keishirou Kumada, Matsumoto (JP); Yasuyuki Hoshi, Matsumoto (JP); Yuichi Hashizume, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 26 days.

(21) Appl. No.: 16/583,443

(22) Filed: Sep. 26, 2019

(65) Prior Publication Data

US 2020/0020797 A1 Jan. 16, 2020

Related U.S. Application Data

(63) Continuation of application No. PCT/JP2018/031240, filed on Aug. 23, 2018.

(30) Foreign Application Priority Data

Oct. 5, 2017 (JP) .............................. JP2017-195431

(51) Int. Cl.
*H01L 29/78* (2006.01)
*H01L 21/8234* (2006.01)
(Continued)

(52) U.S. Cl.
CPC ...... *H01L 29/7811* (2013.01); *H01L 21/8234* (2013.01); *H01L 27/06* (2013.01);
(Continued)

(58) Field of Classification Search
CPC . H01L 29/7811; H01L 21/8234; H01L 27/06; H01L 29/0692; H01L 29/0878;
(Continued)

(56) References Cited

U.S. PATENT DOCUMENTS

2011/0133246 A1 6/2011 Ueno
2015/0255587 A1 9/2015 Nagaoka
(Continued)

FOREIGN PATENT DOCUMENTS

| JP | 5609087 B2 | 10/2014 |
|---|---|---|
| JP | 5915677 B2 | 5/2016 |
| JP | 2017-079324 A | 4/2017 |

*Primary Examiner* — Mohammed R Alam
(74) *Attorney, Agent, or Firm* — Rabin & Berdo, P.C.

(57) ABSTRACT

In an effective region of an active region, a main semiconductor element and a source pad thereof are disposed. A non-operating region of the active region excludes the effective region and is a high-function region in which a gate pad of the main semiconductor element and other electrode pads are disposed. An edge termination region and the electrode pads are separated by an interval equivalent to at least a width of one unit cell of the main semiconductor element. In the high-function region, at a border of the edge termination region, a lead-out electrode is provided on a front surface of a semiconductor substrate. The lead-out electrode has a function of leading out displacement current that flows to the high-function region from the edge termination region when the main semiconductor element is OFF. Thus, destruction at the edge termination region may be suppressed.

15 Claims, 8 Drawing Sheets

(51) Int. Cl.
  *H01L 27/06* (2006.01)
  *H01L 29/06* (2006.01)
  *H01L 29/08* (2006.01)
  *H01L 29/10* (2006.01)
  *H01L 29/16* (2006.01)
  *H01L 29/49* (2006.01)

(52) U.S. Cl.
  CPC ...... *H01L 29/0692* (2013.01); *H01L 29/0878* (2013.01); *H01L 29/1095* (2013.01); *H01L 29/1608* (2013.01); *H01L 29/4941* (2013.01)

(58) Field of Classification Search
  CPC ............. H01L 29/1095; H01L 29/1608; H01L 29/4941; H01L 29/7815; H01L 29/0623; H01L 29/7813; H01L 21/823481; H01L 27/0629; H01L 21/8213; H01L 29/66068
  See application file for complete search history.

(56) References Cited

U.S. PATENT DOCUMENTS

2017/0111037 A1* 4/2017 Shiigi ................ H01L 29/7802
2019/0341308 A1* 11/2019 Urakami ............ H01L 29/0615

* cited by examiner

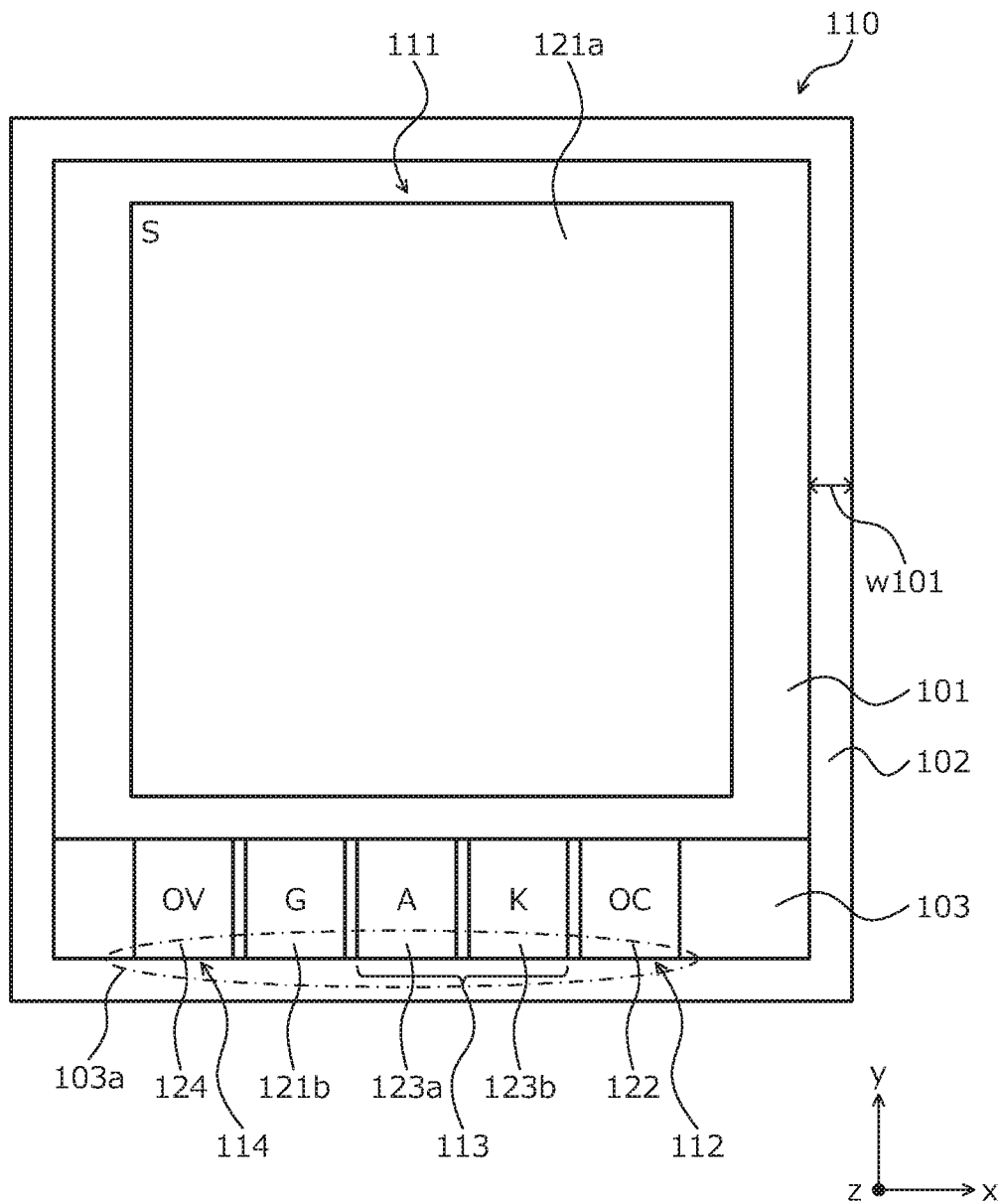

SEMICONDUCTOR DEVICE

CROSS REFERENCE TO RELATED APPLICATIONS

This is a continuation application of International Application PCT/JP2018/031240 filed on Aug. 23, 2018 which claims priority from a Japanese Patent Application No. 2017-195431 filed on Oct. 5, 2017, the contents of which are incorporated herein by reference.

BACKGROUND OF THE INVENTION

1. Field of the Invention

Embodiments of the invention relate to a semiconductor device.

2. Description of the Related Art

Semiconductor materials (hereinafter, wide bandgap semiconductor materials) having a bandgap that is wider than that of silicon (Si) are gaining attention as a semiconductor material enabling fabrication (manufacture) of next generation power semiconductor devices having excellent high-temperature characteristics, high-speed characteristics, and low ON voltage. Further, conventionally, in a power semiconductor device that uses a wide bandgap semiconductor material, a trench gate structure is adopted in a vertical metal oxide semiconductor field effect transistor (MOSFET) that is a switching device and includes an insulated gate constituted by a 3-layer structure including a metal, an oxide film, and a semiconductor.

In the trench gate structure, which is a MOS gate structure in which a MOS gate is embedded in a trench formed at a front surface of a semiconductor substrate (semiconductor chip), a channel (inversion layer) is formed along a side wall of the trench, in a direction orthogonal to the front surface of the semiconductor substrate. Therefore, this is advantageous in terms of cost since unit cell (element configuration unit) density per unit area may be increased and current density per unit area may be increased as compared to a planar gate structure in which a channel is formed along a front surface of a semiconductor substrate. A planar gate structure is a MOS gate structure in which a MOS gate is provided in a flat plate-like shape on the front surface of the semiconductor substrate.

Further, the rate of temperature increase corresponding to the unit-cell occupied volume increases the extent to which the current density of the device is increased and a problem such as peeling of bonding wires occurs, necessitating a double-sided cooling structure to achieve improvements in discharge rate and stabilizing reliability. A double-sided cooling structure is a structure having enhanced heat dissipation of the semiconductor substrate overall by dissipating heat to the outside from both sides of the semiconductor substrate, the heat generated by the semiconductor substrate. In the double-sided cooling structure, the heat generated by the semiconductor substrate is dissipated from a cooling fin in contact with a rear surface of the semiconductor substrate, via a metal base plate, and is dissipated from a metal bar, via a terminal pin having one end bonded to the front surface of the semiconductor substrate while the other end of the terminal pin is bonded to the metal bar.

To further improve reliability, a silicon carbide semiconductor device has been proposed that has a high-performance structure in which a high-function portion such as a temperature sensing portion, an over-voltage protecting portion, and a current sensing portion is disposed on a single semiconductor substrate having a vertical MOSFET, which is a main semiconductor element (for example, refer to Japanese Laid-Open Patent Publication No. 2017-079324). In a case of a high-performance structure, to stabilize and form a high-function portion, a region in which only a high-function portion is disposed is provided in an active region, separated from a unit cell of the main semiconductor element and adjacent to an edge termination region. The active region is a region in which a main current flows when the main semiconductor element is ON. The edge termination region is a region for mitigating electric field in a front side of a semiconductor substrate and for sustaining a breakdown voltage (withstand voltage). The breakdown voltage is a voltage limit at which errant operation or damage of an element does not occur.

A conventional semiconductor device will be described taking, as an example, a case in which silicon carbide (SiC) is used as a wide bandgap semiconductor material. FIG. 11 is a plan view of a layout when the conventional semiconductor device is viewed from a front surface side of the semiconductor substrate. FIG. 11 depicts a layout of each electrode pad. The conventional semiconductor device depicted in FIG. 11 has a current sensing portion 112, a temperature sensing portion 113, and an over-voltage protecting portion 114 in a semiconductor substrate 110 having a vertical MOSFET 111 that is the main semiconductor element. A unit cell (not depicted) of the MOSFET 111 is provided in an active region 101. In the active region 101, at a front surface of the semiconductor substrate 110, a source pad (electrode pad) 121a of the MOSFET 111 is provided.

A periphery of the active region 101 is surrounded by an edge termination region 102. In the active region 101, a high-function region 103 is disposed adjacent to the edge termination region 102. In the high-function region 103, the current sensing portion 112, the temperature sensing portion 113, and the over-voltage protecting portion 114 are provided. Further, in the high-function region 103, portions other than the current sensing portion 112 are adjacent to a unit cell of the MOSFET 111 and, portions (not depicted) other than an $n^+$-type source region of a unit cell of the MOSFET 111 are provided or only a p-type base region (not depicted) extends from the adjacent unit cell of the MOSFET 111. In other words, the high-function region 103 is a non-operating region that does not function as a MOS gate.

In the high-function region 103, at the front surface of the semiconductor substrate 110, a gate pad (electrode pad) 121b of the MOSFET 111, an electrode pad 122 of the current sensing portion 112, electrode pads (anode pad, cathode pad) 123a, 123b of the temperature sensing portion 113, and an electrode pad 124 of the over-voltage protecting portion 114 are provided separated from the source pad 121a of the MOSFET 111. The electrode pads 121b, 122, 123a, 123b, and 124 are provided along a border between the active region 101 and the edge termination region 102. All of the electrode pads 121b, 122, 123a, 123b, and 124 are adjacent to the edge termination region 102.

SUMMARY OF THE INVENTION

According to an embodiment of the invention, a semiconductor device includes a semiconductor substrate of a first-conductivity-type, containing a semiconductor material having a bandgap wider than a bandgap of silicon, the semiconductor substrate having a first main surface and a second main surface opposite to the first main surface, and including an active region in which a main current flows, and a termination region surrounding a periphery of the active region in a plan view of the device, a first second-conductivity-type region of a second-conductivity-type, provided in a surface layer at a first main surface side of the semiconductor substrate in the active region, a second second-conductivity-type region of the second-conductivity-type, provided in the surface layer at the first main surface side of the semiconductor substrate in the active region, and being separated from the first second-conductivity-type region, a first insulated gate field effect transistor including the first second-conductivity-type region as a base region, the first insulated gate field effect transistor having a source pad that is electrically connected to the first second-conductivity-type region, one or more circuits for protecting or controlling the first insulated gate field effect transistor, provided in the second second-conductivity-type region, and one or more electrode pads provided on the first main surface of the semiconductor substrate, and being separated from the termination region, the one or more electrode pads being disposed on a corresponding one of the one or more circuits. The second second-conductivity-type region is provided between the termination region and the electrode pads, and has a fixed electric potential that is the same as an electric potential of the source pad.

In the embodiment, the semiconductor device further includes a first electrode having a fixed electric potential that is the same as an electric potential of the source pad, and being provided on the first main surface of the semiconductor substrate, the first electrode being provided between the termination region and the one or more electrode pads, the first electrode being separated from the one or more electrode pads. The second second-conductivity-type region is set to have the electric potential of the source pad via the first electrode.

In the embodiment, the one or more electrode pads include a plurality of electrode pads, and the second second-conductivity-type region and the first electrode are provided between two electrode pads that are adjacent to each other of the plurality of electrode pads.

In the embodiment, the semiconductor device further includes a high-function region in which the one or more circuits and the electrode pads are disposed, the high-function region being provided in the active region and adjacent to the termination region. The second second-conductivity-type region is provided in the surface layer at the first main surface side of the semiconductor substrate over all of the high-function region.

In the embodiment, the first insulated gate field effect transistor includes the first second-conductivity-type region, a first-conductivity-type region that is a portion of the semiconductor substrate other than the first second-conductivity-type region and the second second-conductivity-type region, a first trench penetrating the first second-conductivity-type region in a depth direction and reaching the first-conductivity-type region, a first gate insulating film provided on an inner surface of the first trench, a first gate electrode provided in the first trench on the first gate insulating film, the source pad, the source pad being electrically connected to the first-conductivity-type region and the first second-conductivity-type region, and a second electrode provided on the second main surface of the semiconductor substrate, the semiconductor device further including a second trench penetrating the second second-conductivity-type region in the depth direction and reaching the first-conductivity-type region, a second gate insulating film provided on an inner surface of the second trench, and a second gate electrode provided in the second trench on the second gate insulating film. The second trench, the second gate insulating film, and the second gate electrode have configurations identical to configurations of the first trench, the first gate insulating film, and the first gate electrode, respectively.

In the embodiment, the one or more electrode pads include a plurality of electrode pads, and the first second-conductivity-type region is provided between two of the electrode pads that are adjacent to each other.

In the embodiment, the one of the one or more circuits is a second insulated gate field effect transistor that detects overcurrent flowing in the first insulated gate field effect transistor, and has a configuration identical a configuration of the first insulated gate field effect transistor.

In the embodiment, one of the one or more circuits is a diode that detects a temperature of the first insulated gate field effect transistor.

In the embodiment, one of the one or more circuits is a diode that protects the first insulated gate field effect transistor from overvoltage.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 11 is a plan view of a layout when a conventional semiconductor device is viewed from a front surface side of a semiconductor substrate.

DETAILED DESCRIPTION OF THE INVENTION

Figure 1:
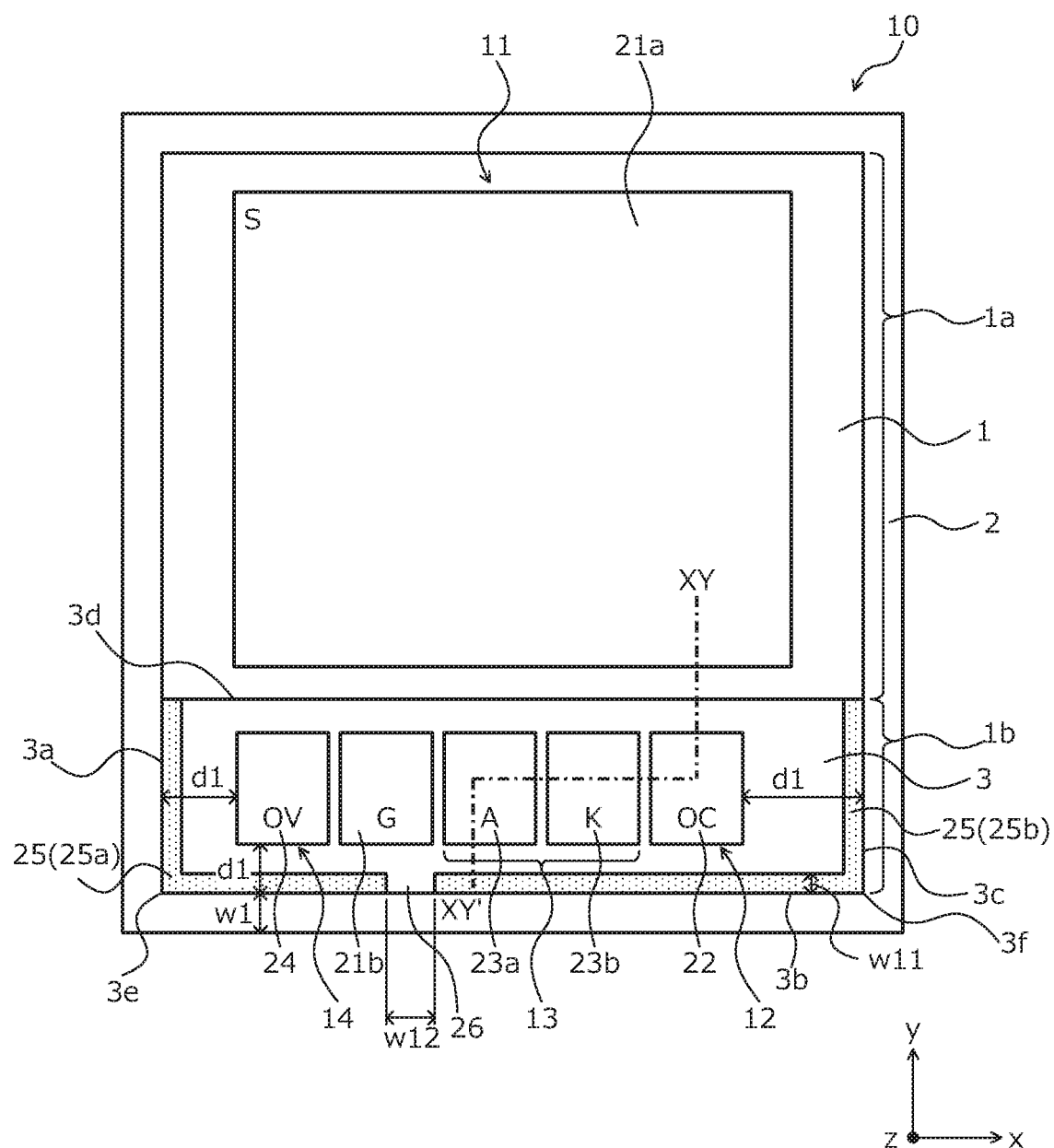
FIG. 1 is a plan view of a layout when a semiconductor device according to a first embodiment is viewed from a front surface side of a semiconductor substrate.

First, problems associated with the conventional techniques will be discussed. In the conventional semiconductor device (refer to FIG. 11) described, a wide bandgap semiconductor material is used as a semiconductor material and therefore, as compared to a case in which silicon is used as a semiconductor material, a width w101 of the edge termination region 102 may be reduced by about ⅕ to ½. Additionally, a thickness (thickness of the semiconductor substrate 110) of the edge termination region 102 may be reduced by ½. Therefore, the width w101 of the edge termination region 102 is reduced and the thickness of the edge termination region 102 is reduced, thereby enabling ON resistance (RonA) of the MOSFET 111 to be reduced.

Nonetheless, by reducing the width w101 of the edge termination region 102 and the thickness of the edge termination region 102, capacitance (pn junction capacitance) of a depletion layer that in a direction (horizontal direction) parallel to the front surface of the semiconductor substrate 110, spreads from a pn junction (not depicted) between the p-type base region and an n⁻-type drift region toward a chip edge when the MOSFET 111 is OFF decreases. Therefore, when voltage between a drain and a source varies (hereinafter, dv/dt surge) briefly due to, for example, noise such as surges during switching of the MOSFET 111 (particularly when the MOSFET 111 is OFF), displacement current that flows to the pn junction capacitance increases significantly. In particular, a current value of the displacement current that flows during charging and discharging of the pn junction capacitance is a current value when silicon is used as a semiconductor material times the volume by which the edge termination region 102 is reduced.

When the MOSFET 111 is OFF, the displacement current flows from the edge termination region 102 toward the active region 101, and is lead out from the active region 101 and the p-type base region of the high-function region 103 to a source electrode. The n⁺-type source region, etc. are not disposed in the high-function region 103 and therefore, a mathematical area of the p-type base region is larger than mathematical areas of other portions of the active region 101. As a result, although the displacement current concentrates in the high-function region 103, as described above, in the high-function region 103, the gate pad 121b and the electrode pads 122, 123a, 123b are disposed adjacent to a border 103a with the edge termination region 102 and therefore, the displacement current is not lead out. The displacement current concentrates and as a result, an element near the border 103a between the edge termination region 102 and the high-function region 103 may be destroyed.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to a first embodiment is configured using a semiconductor material (wide bandgap semiconductor material) that has a bandgap that is wider than a bandgap of silicon (Si). A structure of the semiconductor device according to the first embodiment will be described taking, as an example, a case in which, for example, silicon carbide (SiC) is used as the wide bandgap semiconductor material. FIG. 1 is a plan view of a layout when the semiconductor device according to the first embodiment is viewed from a front surface side of a semiconductor substrate. FIG. 1 depicts a layout of electrode pads of elements disposed in a semiconductor substrate (semiconductor chip) 10.

The semiconductor device according to the first embodiment and depicted in FIG. 1 has in the semiconductor substrate 10 containing silicon carbide, a main semiconductor element (first insulated gate field effect transistor) 11 and as circuit portions for protecting/controlling the main semiconductor element 11, high-function portions, e.g., a current sensing portion (second insulated gate field effect transistor) 12, a temperature sensing portion 13, an over-voltage protecting portion 14, and a calculating circuit portion (not depicted). The main semiconductor element 11 is a vertical MOSFET in which drift current flows in a vertical direction (a depth direction Z of the semiconductor substrate 10) in an ON state and is configured by plural non-depicted unit cells (functional units) disposed adjacent to each other. The main semiconductor element 11 performs a main operation.

The main semiconductor element 11 is disposed in an effective region (region functioning as a MOS gate) 1a of an active region 1. An effective region 1a of the active region 1 is a region in which a main current flows when the main semiconductor element 11 is ON, and a periphery thereof is surrounded by an edge termination region 2. In the effective region 1a of the active region 1, on a front surface of the semiconductor substrate 10, a source pad 21a that is an electrode pad of the main semiconductor element 11 is provided. The source pad 21a has, for example, a rectangular planar shape and covers, for example, substantially the entire effective region 1a of the active region 1. In FIG. 1, the source pad 21a is indicated by S (similarly in FIGS. 9 and 10).

The edge termination region 2 is a region between the active region 1 and a chip (the semiconductor substrate 10) edge, and is a region for mitigating electric field at a front surface side of the semiconductor substrate 10 and for sustaining a breakdown voltage (withstand voltage). In the edge termination region 2, for example, an edge termination structure (not depicted) such as a guard ring, a p-type region forming a junction termination extension (JTE) structure, a field plate, a RESURF, etc. is disposed. The breakdown voltage is a limit voltage at which no errant operation or destruction of an element occurs. A width w1 of the edge termination region 2 may be, for example, about 50 μm.

Further, in the active region 1, a high-function region 3 is provided adjacent to the edge termination region 2. The high-function region 3 has, for example, a substantially rectangular planar shape. In the high-function region 3, high-function portions such as the current sensing portion 12, the temperature sensing portion 13, the over-voltage protecting portion 14, and the calculating circuit portion (not depicted) are provided. In FIG. 1, while the current sensing portion 12, the temperature sensing portion 13, and the over-voltage protecting portion 14 are depicted as high-function portions, a high-function portion other than the current sensing portion 12, the temperature sensing portion 13, and the over-voltage protecting portion 14 may be disposed in the high-function region 3.

The current sensing portion 12 has a function of detecting over current (OC) that flows in the main semiconductor element 11. The current sensing portion 12 is a vertical MOSFET that includes several unit cells of a same configuration as the main semiconductor element 11. The temperature sensing portion 13 has a function of detecting a temperature of the main semiconductor element 11 by using temperature characteristics of a diode. The over-voltage protecting portion 14 is a diode that protects the main semiconductor element 11 from, for example, over voltage (OV) such as surges.

The calculating circuit portion controls the current sensing portion 12, the temperature sensing portion 13, and the over-voltage protecting portion 14, and based on signals output from these portions, controls the main semiconductor element 11. In a portion of the high-function region 3 other than the current sensing portion 12 and calculating circuit portion, parts (a p-type base region (second second-conductivity-type region) 34b described hereinafter (refer to FIG. 2), a gate insulating film (second gate insulating film) 38b, and a gate electrode (second gate electrode) 39b) other than an $n^+$-type source region of a MOSFET having a configuration similar to the unit cell of the main semiconductor element 11 are provided, or the p-type base region 34b alone is provided. In other words, the high-function region 3 is a non-operating region (region not functioning as a MOS gate) 1b of the active region 1.

The p-type base region 34b is provided in the high-function region 3 overall and reaches a border between the high-function region 3 and the edge termination region 2. The p-type base region 34b, as described hereinafter, is disposed separated from a p-type base region (first second-conductivity-type region) 34a (refer to FIG. 2) of the main semiconductor element 11. A portion of the high-function region 3 other than the current sensing portion 12 and the calculating circuit portion may be adjacent to a unit cell of the main semiconductor element 11, and include parts other than the $n^+$-type source region of a MOSFET having a configuration similar to that of the unit cell of the main semiconductor element 11. A reason for this is that when the main semiconductor element 11 is OFF, carrier density in the high-function region 3 may be set to be in a state substantially identical to that of a carrier density in the effective region 1a of the active region 1.

Further, in the high-function region 3, along a border between the active region 1 and the edge termination region 2 (for example, a side 3b of the high-function region 3, opposite a side 3d of the high-function region 3 facing toward the effective region 1a), a gate pad 21b that is an electrode pad of the main semiconductor element 11, an electrode pad 22 of the current sensing portion 12, electrode pads 23a, 23b of the temperature sensing portion 13, and an electrode pad 24 of the over-voltage protecting portion 14 are provided on the front surface of the semiconductor substrate 10 so as to be separated from each other and separated from the source pad 21a and the edge termination region 2. The electrode pads 21b, 22, 23a, 23b, and 24 have, for example, a substantially rectangular planar shape.

In FIG. 1, while a case is depicted in which the electrode pads 21b, 22, 23a, 23b, and 24 are disposed in parallel on a single straight line, various changes in arrangement are possible. In FIG. 1, the gate pad 21b, the electrode pad (hereinafter, OC pad) 22 of the current sensing portion 12, the electrode pads (hereinafter, anode pad and cathode pad) 23a, 23b of the temperature sensing portion 13, and the electrode pad (hereinafter, OV pad) 24 of the over-voltage protecting portion 14 are indicated by G, OC, A, K, and OV, respectively (similarly in FIGS. 9 and 10). The gate pad 21b is electrically connected to gate electrodes (first gate electrodes) 39a (refer to FIG. 2) of all the unit cells of the main semiconductor element 11, for example, via a gate runner (not depicted).

The edge termination region 2 is separated from the gate pad 21b, the OC pad 22, the anode pad 23a, the cathode pad 23b, and the OV pad 24 by an interval d1 that is at least equivalent to a width of one unit cell of the main semiconductor element 11. In particular, the interval d1 between the edge termination region 2 and the gate pad 21b, the OC pad 22, the anode pad 23a, the cathode pad 23b and the OV pad 24 is, for example, about 5 times to 10 times a total thickness (i.e., a thickness t1 of an $n^-$-type silicon carbide layer 71: refer to FIG. 2) of an $n^-$-type drift region (first-conductivity-type region) 32 and an n-type current spreading region 33a described hereinafter.

Further, in the high-function region 3, at the border thereof with the edge termination region 2, a lead-out electrode 25 ((first electrode) indicated by hatched portion) is provided on the front surface of the semiconductor substrate 10. In the high-function region 3, the lead-out electrode 25 is not provided at a border of the effective region 1a of the active region 1. The lead-out electrode 25 and the p-type base region 34b are fixed at an electric potential (source potential) of the source pad 21a. In particular, the lead-out electrode 25 is electrically connected to the p-type base region 34b (refer to FIG. 2) of the high-function region 3. The lead-out electrode 25 has a function of leading out, via the p-type base region 34b, displacement current that flows to the high-function region 3 from the edge termination region 2 when the main semiconductor element 11 is OFF.

The lead-out electrode 25 is provided between the edge termination region 2 and the gate pad 21b, the OC pad 22, the anode pad 23a, the cathode pad 23b, and the OV pad 24 and is provided separated from the electrode pads 21a, 22, 23a, 23b, 24. Additionally, a region (hereinafter, gate contact metal region) 26 in which a region (non-depicted metal electrode) where a contact metal (hereinafter, gate contact metal) for connecting the gate pad 21b and the gate runner is disposed is disposed between the gate pad 21b and the edge termination region 2. The lead-out electrode 25 is not provided in the gate contact metal region 26.

In particular, the high-function region 3 has a substantially rectangular planar shape and of the three sides 3a, 3b, 3c thereof forming borders with the edge termination region 2, the lead-out electrode 25 is provided in a substantially L-shaped planar shape along the sides 3a, 3b having a vertex 3e in common, and the lead-out electrode 25 is further provided in a substantially L-shaped planar shape along the sides 3b, 3c having a vertex 3f in common. The gate contact metal region 26 is provided between the lead-out electrodes 25 (25a, 25b) facing the vertices 3e, 3f of the high-function region 3. When the gate contact metal region 26 is provided in plural, it suffices to provide three or more of the lead-out electrodes 25.

A width w11 of the lead-out electrode 25 may be, for example, about 10 µm. The gate runner is provided on the front surface of the semiconductor substrate 10, along the border between the active region 1 and the edge termination region 2, closer to the periphery (closer to the chip edge) than is the lead-out electrode 25, so as to surround a periphery of the active region 1. A gate pad contact metal is provided on the front surface of the semiconductor substrate 10, in the gate contact metal region 26. A width of the gate pad contact metal is narrower than a width w12 of the gate contact metal region 26 and may be, for example, about 10 µm. The width w12 of the gate contact metal region 26 may be, for example, in a range from about 30 µm to 50 µm.

In this manner, in the high-function region 3, the electrode pads 21a, 22, 23a, 23b, 24 are disposed separated from the edge termination region 2, and the lead-out electrode 25 is provided along the three sides 3a, 3b, 3c of the high-function region 3 forming the borders with the edge termination region 2. As a result, when the main semiconductor element 11 is OFF, carrier densities of portions of the high-function region 3 toward the sides 3a, 3b, 3c that form the borders with the edge termination region 2 and carrier density of a portion toward the side 3d that forms a border with the effective region 1a of the active region 1 may be set to be in substantially similar states with respect to the electrode pads 21a, 22, 23a, 23b, 24.

Figure 2:
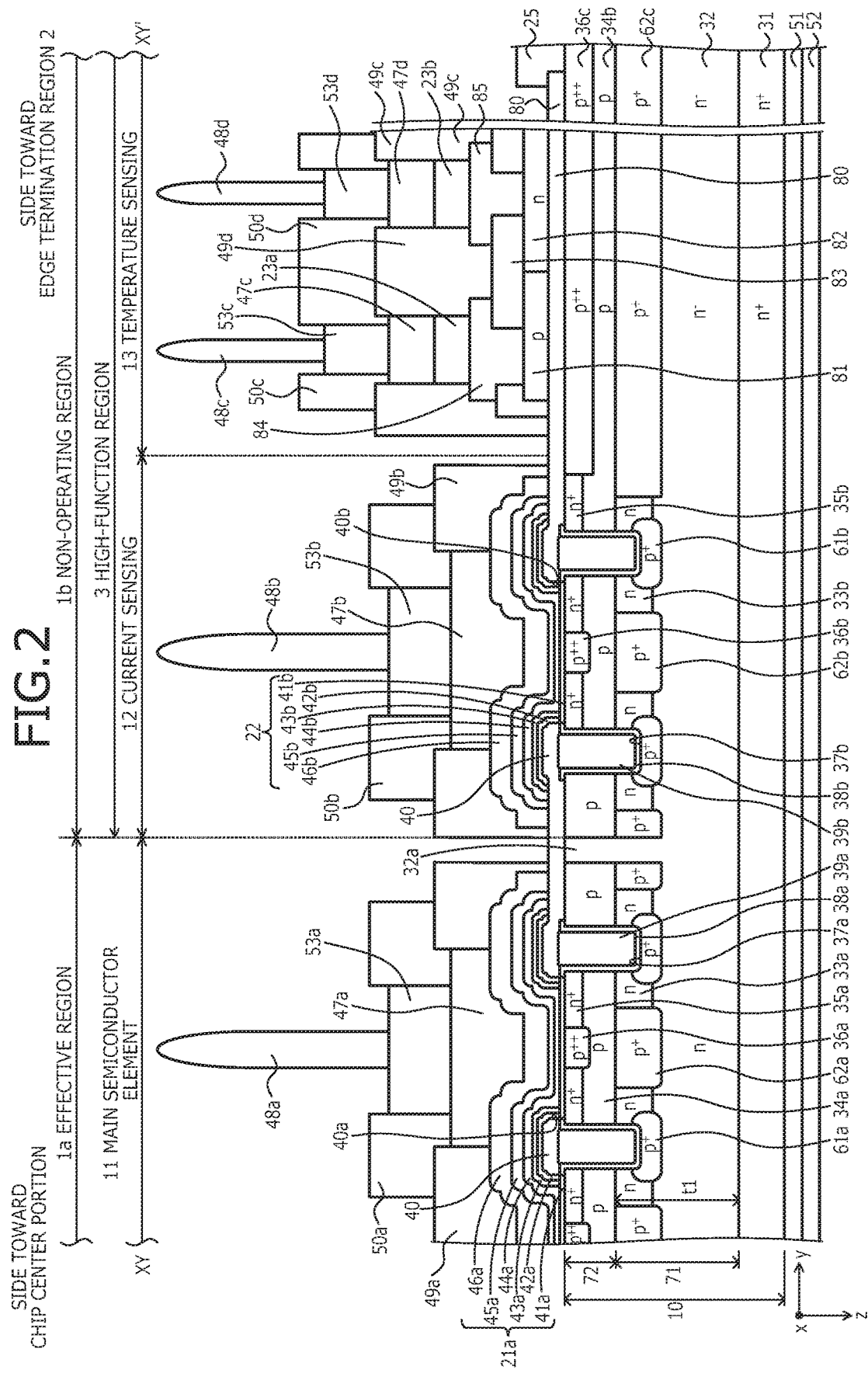
FIG. 2 is a cross-sectional view of a structure along cutting line XY-XY' in FIG. 1.

An example of a cross-sectional structure of the main semiconductor element 11, the current sensing portion 12, and the temperature sensing portion 13 will be described. FIG. 2 is a cross-sectional view of the structure along cutting line XY-XY' in FIG. 1. FIG. 2 is a cross-sectional view of the structure along cutting line XY-XY', from a portion of the effective region 1a of the active region 1 depicted in FIG. 1, to a portion (portion passing through the OC pad 22, the cathode pad 23b, and the anode pad 23a of the non-operating region 1b of the active region 1 to the lead-out electrode 25) of the high-function region 3. Further, only two adjacent unit cells of the main semiconductor element 11 are depicted, and other adjacent unit cells of the main semiconductor element 11, toward a center portion of the chip (the semiconductor substrate 10) including the unit cells are not depicted.

The main semiconductor element 11 is a vertical MOSFET that includes at the front surface side (side having the p-type base region 34a) of the semiconductor substrate 10, a MOS gate having a trench gate. The semiconductor substrate 10 is formed by sequentially forming by epitaxial growth on an $n^+$-type starting substrate (first-conductivity-type region) 31 containing silicon carbide, the $n^-$-type silicon carbide layer 71 and a p-type silicon carbide layer 72 that form the $n^-$-type drift region 32 and the p-type base region 34a. The MOS gate includes the p-type base region 34a, an $n^+$-type source region 35a, a $p^{++}$-type contact region 36a, a trench (first trench) 37a, a gate insulating film (first gate insulating film) 38a, and the gate electrode 39a.

In particular, the trench 37a penetrates the p-type silicon carbide layer 72 (the p-type base region 34a) from the front surface of the semiconductor substrate 10 (surface of the p-type silicon carbide layer 72) in the depth direction and reaches the $n^-$-type silicon carbide layer 71. The depth direction Z is a direction from the front surface toward a rear surface of the semiconductor substrate 10. The trench 37a, for example, is disposed in a striped shape (not depicted) extending in a direction (hereinafter, first direction, refer to FIG. 1) X that is parallel to the front surface of the semiconductor substrate 10 and along which the electrode pads 21a, 22, 23a, 23b, 24 are arranged, or a direction (hereinafter, second direction) Y that is parallel to the front surface of the semiconductor substrate 10 and orthogonal to the first direction X.

The trench 37a may be disposed in, for example, a matrix-shape as viewed from the front surface side of the semiconductor substrate 10. In the trench 37a, the gate insulating film 38a is provided along an inner wall of the trench 37a, and the gate electrode 39a is provided on the gate insulating film 38a so as to be embedded in the trench 37a. A single unit cell of the main semiconductor element 11 includes the gate electrode 39a in a single trench 37a, and adjacent mesa regions that sandwich the gate electrode 39a (a mesa region being a region between adjacent trenches 37a.

In a surface layer of the $n^-$-type silicon carbide layer 71, the surface layer on a source side (side having the source pad 21a) of the $n^-$-type silicon carbide layer 71, the n-type region (hereinafter, n-type current spreading region) 33a is provided so as to be in contact with the p-type silicon carbide layer 72 (the p-type base region 34a). The n-type current spreading region 33a is a so-called current spreading layer (CSL) that reduces carrier spreading resistance. The n-type current spreading region 33a, for example, is provided uniformly along a direction parallel to a substrate front surface (the front surface of the semiconductor substrate 10) so as to be exposed at the inner wall of the trench 37a.

The n-type current spreading region 33a, from an interface with the p-type base region 34a, reaches a position that is deeper toward a drain side (side having a drain electrode (second electrode) 51) than is a position of a bottom of the trench 37a. A portion of the $n^-$-type silicon carbide layer 71 other than the n-type current spreading region 33a and an n-type current spreading region 33b described hereinafter forms the $n^-$-type drift region 32. In the n-type current spreading region 33a, first and second $p^+$-type regions 61a, 62a may be selectively provided. The first $p^+$-type region 61a covers at least a bottom of the trench 37a, of the bottom and a bottom corner portion of the trench 37a. The bottom corner portion of the trench 37a is a border between the bottom and a side wall of the trench 37a.

Further, the first $p^+$-type region 61a is disposed separated from the p-type base region 34a, at a position that is deeper toward the drain side than is a position of an interface between the p-type base region 34a and the n-type current spreading region 33a. The second $p^+$-type region 62a is provided between adjacent trenches 37a (in a mesa region) and is provided to be separated from the first $p^+$-type region 61a and the trench 37a, and in contact with the p-type base region 34a. Pn junctions between the first and the second $p^+$-type regions 61a, 62a and the n-type current spreading region 33a (or the $n^-$-type drift region 32) are formed at positions deeper toward the drain side than is the position of the bottom of the trench 37a.

The first and the second $p^+$-type regions 61a, 62a may be provided in the $n^-$-type drift region 32 without provision of the n-type current spreading region 33a. Provided positions of the first and the second $p^+$-type regions 61a, 62a deep toward the drain side are such that the pn junctions between the first and the second $p^+$-type regions 61a, 62a and the n-type current spreading region 33a (or the $n^-$-type drift region 32) are deeper toward the drain side than is the bottom of the trench 37a, various modifications may be made according to design conditions. Application of high electric field to a portion of the gate insulating film 38a along the bottom of the trench 37a may be prevented by the first and the second $p^+$-type regions 61a, 62a.

The $n^+$-type source region 35a and the $p^{++}$-type contact region 36a are selectively provided in the p-type silicon carbide layer 72 so as to be in contact with each other. The $n^+$-type source region 35a is in contact with the gate insulating film 38a at the side wall of the trench 37a and faces the gate electrode 39a across the gate insulating film 38a at the side wall of the trench 37a. A portion of the p-type silicon carbide layer 72 other than the $n^+$-type source region 35a, the $p^{++}$-type contact region 36a, an $n^+$-type source region 35b, and $p^{++}$ type contact regions 36b, 36c described hereinafter forms the p-type base region 34a.

An interlayer insulating film 40 is provided at the front surface of the semiconductor substrate 10 overall so as to cover the gate electrodes 39b of the current sensing portion 12 described hereinafter and the gate electrodes 39a. All of the gate electrodes 39a, 39b are electrically connected to the gate pad 21b (refer to FIG. 1) via the gate runner (not depicted), at a portion not depicted. A contact hole 40a is opened in the interlayer insulating film 40, the contact hole 40a penetrating the interlayer insulating film 40 in the depth direction Z and reaching the substrate front surface.

The source pad (source electrode) 21a forms an ohmic contact with the semiconductor substrate 10 (the $n^+$-type source region 35a and the $p^{++}$-type contact region 36a) in the contact hole 40a, and is electrically insulated from the gate electrodes 39a, 39b by the interlayer insulating film 40. The source pad 21a has, for example, a nickel silicide (NiSi) film 41a, a first titanium nitride (TiN) film 42a, a first titanium (Ti) film 43a, a second TiN film 44a, a second Ti film 45a, and an aluminum (Al) alloy film 46a.

The NiSi film 41a, in the contact hole 40a, forms an ohmic contact with the semiconductor substrate 10 (the $n^+$-type source region 35a and the $p^{++}$-type contact region 36a). Further, the NiSi film 41a is electrically insulated from the gate electrode 39a by the interlayer insulating film 40. The NiSi film 41a is provided only on a portion (bottom of the contact hole 40a) of the semiconductor substrate 10 exposed in the contact hole 40a. Instead of the NiSi film 41a, for example, a titanium silicide (TiSi) film may be provided.

The first TiN film 42a covers a portion of the interlayer insulating film 40 and faces the gate electrode 39a in the depth direction Z, across the interlayer insulating film 40. The first TiN film 42a has a function of preventing salt that is generated in treatment solution for plating preprocessing from entering the gate insulating film 38a and the gate electrode 39a. The plating preprocessing is a surface treatment for cleaning a surface (surface of the Al alloy film 46a) for plating, and is performed before a plating process for forming a plating film 47a described hereinafter.

The first Ti film 43a, for example, is provided only on the first TiN film 42a. The second TiN film 44a is provided on and spans the front surface of the semiconductor substrate 10 from on the interlayer insulating film 40, and covers the first Ti film 43a and the NiSi film 41a. The second Ti film 45a is provided on the second TiN film 44a. The Al alloy film 46a is provided on the second Ti film 45a so as to be embedded in the contact hole 40a. The first and the second Ti films 43a, 45a and the second TiN film 44a are barrier metals for obtaining a function different from a function of the first TiN film 42a.

The Al alloy film 46a is a metal film that contains as a main component, aluminum that has favorable electrical conductivity and that is chemically stable. The Al alloy film 46a may be, for example, an aluminum-silicon (Al—Si) film, an aluminum-silicon-copper (Al—Si—Cu) film, or an aluminum-copper (Al—Cu) film. Instead of the Al alloy film 46a, an aluminum film may be provided. One end of the terminal pin 48a is bonded on the source pad 21a via the plating film 47a and a solder layer 53a.

Another end of the terminal pin 48a is bonded to a metal bar (not depicted) that is disposed so as to face the front surface of the semiconductor substrate 10. The other end of the terminal pin 48a is further exposed on an outer side of a case (not depicted) to which the semiconductor chip (the semiconductor substrate 10) is mounted, and the other end of the terminal pin 48a is electrically connected to an external device (not depicted). In other words, the terminal pin 48a is, for example, an external connection terminal that carries out electric potential of the source pad 21a to an external destination. The terminal pin 48a is a wiring member that has a round bar-shape (cylindrical shape) having a predetermined diameter. The terminal pin 48a is soldered to the plating film 47a in a substantially upright state relative to the front surface of the semiconductor substrate 10.

The plating film 47a, even under high temperature conditions (for example, 200 degrees C. to 300 degrees C.), has high adhesion with the source pad 21a and does not easily peel as compared to wire bonding. A first protective film 49a covers a portion of the surface of the source pad 21a other than where the plating film 47a is provided. In particular, the first protective film 49a is provided so as to cover the source pad 21a and in an opening of the first protective film 49a, the terminal pin 48a is bonded to the first protective film 49a via the plating film 47a and the solder layer 53a. A second protective film 50a covers a border between the plating film 47a and the first protective film 49a. The first and the second protective films 49a, 50a are, for example, polyimide films.

The drain electrode 51 forms an ohmic contact with a rear surface (rear surface of the $n^+$-type starting substrate 31 that is an $n^+$-type drain region) of the semiconductor substrate 10 overall. A drain pad (electrode pad) 52 is provided on the drain electrode 51. The drain pad 52 is soldered to a metal base plate (not depicted) and is in contact with at least one portion of a base part of a cooling fin (not depicted) via the metal base plate. A double-sided cooling structure is formed in which heat generated at the semiconductor substrate 10 is dissipated from fin parts of the cooling fin that is in contact with the rear surface of the semiconductor substrate 10 via the metal base plate, and is dissipated from the metal bar to which the terminal pin 48a of the front surface of the semiconductor substrate 10 is bonded.

The p-type region 34b is provided in a surface layer of the front surface of the semiconductor substrate 10, for example, spanning the high-function region 3 overall. The p-type region 34b of the high-function region 3 serves as a p-type base region of the current sensing portion 12. An $n^-$-type region 32a is provided between the p-type region 34b of the high-function region 3 and the p-type base region 34a of the effective region 1a of the active region 1. The $n^-$-type region 32a penetrates the p-type silicon carbide layer 72 in the depth direction Z and reaches the $n^-$-type silicon carbide layer 71.

The $n^-$-type region 32a is provided at a border between the effective region 1a of the active region 1 and the high-function region 3. The $n^-$-type region 32a may be provided along a side of the effective region 1a, in the active region 1 or in the high-function region 3, or straddling the high-function region 3 from the effective region 1a. The p-type region 34b of the high-function region 3 and the p-type base region 34a of the effective region 1a of the active region 1 are separated by the $n^-$-type region 32a.

The current sensing portion 12, as described above, is a vertical MOSFET that has a unit cell of a same configuration as the main semiconductor element 11 and is provided in the high-function region 3. In particular, the MOS gate of the current sensing portion 12 includes a p-type region (hereinafter, p-type base region) 34b, the $n^+$-type source region 35b, the $p^{++}$-type contact region 36b, a trench (second trench) 37b, the gate insulating film 38b, and the gate electrode 39b having configurations similar to corresponding parts of the main semiconductor element 11.

The current sensing portion 12, similarly to the main semiconductor element 11, may have the n-type current spreading region 33b and first and second $p^+$-type regions 61b, 62b. The n-type current spreading region 33b and the first and the second $p^+$-type regions 61b, 62b are separated from the p-type base region 34a, the n-type current spreading region 33a and the first and the second p⁺-type regions 61a, 62a of the effective region 1a of the active region 1 by the n⁻-type region 32a.

The electrode pad (source electrode) 22 of the current sensing portion 12 is configured by, for example, an NiSi film 41b, a first TiN film 42b, a first Ti film 43b, a second TiN film 44b, a second Ti film 45b, and an Al alloy film 46b having functions and stacked structures similarly to the source pad 21a of the main semiconductor element 11. The NiSi film 41b, in a contact hole 40b, forms an ohmic contact with the semiconductor substrate 10 (the n⁺-type source region 35b and the p⁺⁺-type contact region 36b). The NiSi film 41b is provided only on a portion (bottom of the contact hole 40b) of the semiconductor substrate 10 exposed in the contact hole 40b.

The first TiN film 42b covers a portion of the interlayer insulating film 40 and faces the gate electrode 39b in the depth direction Z, across the interlayer insulating film 40. The first TiN film 42b has a function of preventing salt that is generated in a treatment solution for the plating preprocessing from entering the gate insulating film 38b and the gate electrode 39b. The first Ti film 43b, for example, is provided only on the first TiN film 42b. The second TiN film 44b is provided on and spans the front surface of the semiconductor substrate 10 from on the interlayer insulating film 40, covering the first Ti film 43b and the NiSi film 41b.

The second Ti film 45b is provided on the second TiN film 44b. The Al alloy film 46b is provided on the second Ti film 45b so as to be embedded in the contact hole 40b. On the OC pad 22, similarly to the terminal pin 48a on the source pad 21a of the main semiconductor element 11, one end of a terminal pin 48b is bonded via a plating film 47b and the solder layer 53b. Another end of the terminal pin 48b is exposed on the outer side of the case (not depicted) and is electrically connected to an external device (not depicted).

Similarly to the source pad 21a of the main semiconductor element 11, a portion of the surface of the OC pad 22 other than where the plating film 47b is provided is covered by a first protective film 49b. In particular, the first protective film 49b is provided so as to cover the OC pad 22 and in an opening of the first protective film 49b, the terminal pin 48b is bonded to the first protective film 49b via the plating film 47b and the solder layer 53b. A border between the plating film 47b and the first protective film 49b is covered by a second protective film 50b. The first and second protective films 49b, 50b are, for example, polyimide films.

The temperature sensing portion 13 is a poly-silicon diode formed by a pn junction between a p-type poly-silicon layer 81 and an n-type poly-silicon layer 82. The p-type poly-silicon layer 81 and the n-type poly-silicon layer 82 are provided in the high-function region 3, on a field insulating film 80. Instead of the p-type poly-silicon layer 81 and the n-type poly-silicon layer 82, the temperature sensing portion 13 may be a spreading diode formed by a pn junction between p-type spreading region and an n-type spreading region. In this case, for example, the p-type spreading region and the n-type spreading region forming the spreading diode are selectively formed in an n-type separation region that is selectively formed in the p-type base region 34b.

The anode pad 23a is electrically connected to the p-type poly-silicon layer 81 via an anode electrode 84. The cathode pad 23b is electrically connected to the n-type poly-silicon layer 82 via a cathode electrode 85. Similarly to the source pad 21a of the main semiconductor element 11, terminal pins 48c, 48d are bonded to the anode pad 23a and the cathode pad 23b, respectively, by plating films 47c, 47d and solder layers 53c, 53d. Reference numeral 83 is an interlayer insulating film; reference characters 49c, 49d are first protective films; and reference characters 50c, 50d are second protective films. The terminal pins 48c, 48d need not be provided directly on the p-type poly-silicon layer 81 and the n-type poly-silicon layer 82, respectively, and may be lead around the anode pad 23a and the cathode pad 23b to be provided at a different position on the front surface of the semiconductor substrate 10.

In a portion of the high-function region 3 other than the current sensing portion 12, the p⁺⁺-type contact region 36c is selectively provided in the p-type base region 34b. The p⁺⁺-type contact region 36c is in contact with the n⁺-type source region 35b of the current sensing portion 12. The p⁺⁺-type contact region 36c, at a non-depicted portion, is electrically connected to the lead-out electrode 25 (refer to FIG. 1). Further, in a portion of the high-function region 3 other than the current sensing portion 12, similarly to the second p⁺-type region 62b of the current sensing portion 12, a second p⁺-type region 62c is provided in the n⁻-type drift region 32. The second p⁺-type region 62c is in contact with the p-type base region 34b.

Although not depicted, the main semiconductor element 11 and circuit portions (the current sensing portion 12, the temperature sensing portion 13, the over-voltage protecting portion 14, and the calculating circuit portion) protecting/controlling the main semiconductor element 11 have wiring structures having a same configuration used for a pin-shaped wiring member (terminal pin described hereinafter) soldered to the electrode pads 21a, 21b, 22, 23a, 23b, 24.

Figure 3:
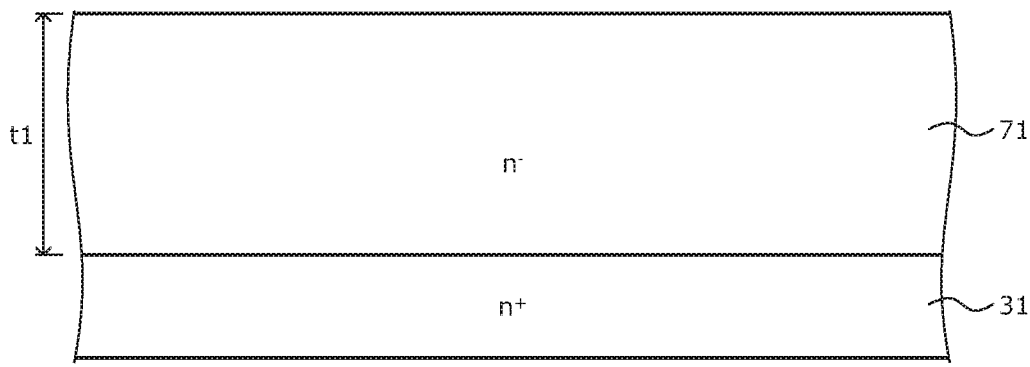
FIG. 3 is a cross-sectional view of the semiconductor device according to the first embodiment during manufacture.

A method of manufacturing the semiconductor device according to the embodiment will be described with reference to FIGS. 2 to 8. FIGS. 3, 4, 5, 6, 7, and 8 are cross-sectional views of the semiconductor device according to the first embodiment during manufacture. In FIGS. 3 to 8, only the effective region 1a of the active region 1 is depicted. In other words, of all the elements fabricated (manufactured) on the single semiconductor substrate 10, only the main semiconductor element 11 is depicted. First, as depicted in FIG. 3, the n⁺-type starting substrate (semiconductor wafer) 31 that contains silicon carbide is prepared.

The n⁺-type starting substrate 31 may be, for example, a silicon carbide single crystal substrate doped with nitrogen (N). A front surface of the n⁺-type starting substrate 31 may be, for example, a (0001) plane, a so-called Si-face. Next, on the front surface of the n⁺-type starting substrate 31, the n⁻-type silicon carbide layer 71 doped with nitrogen at a concentration lower than that of the n⁺-type starting substrate 31 is formed by epitaxial growth. In a case of a breakdown voltage of 1200V, the thickness t1 of the n⁻-type silicon carbide layer 71, may be for example, about 10 μm.

Figure 4:
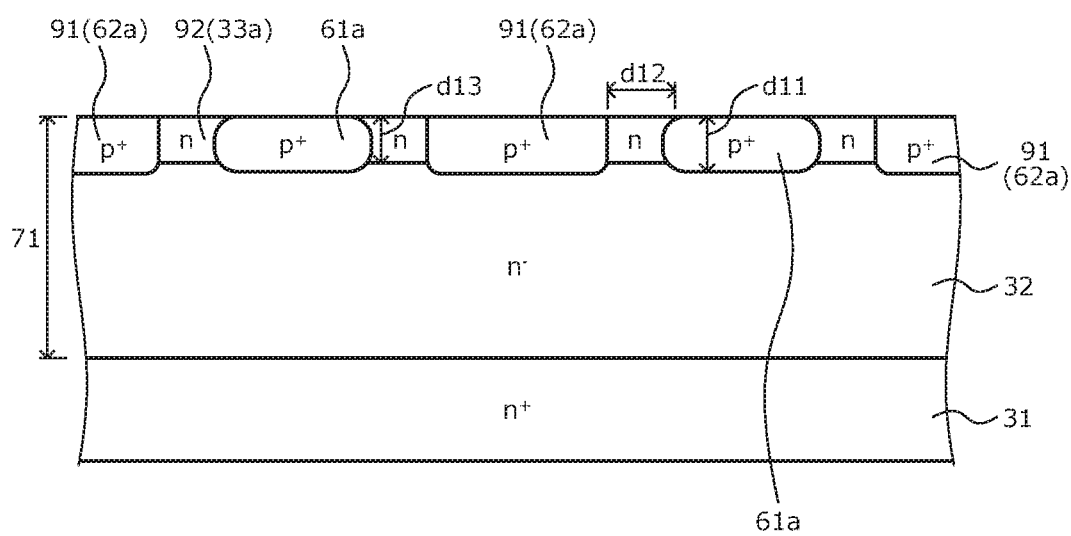
FIG. 4 is a cross-sectional view of the semiconductor device according to the first embodiment during manufacture.

Next, as depicted in FIG. 4, by photolithography and ion implantation of a p-type impurity, for example, aluminum, the first p⁺-type regions 61a, 61b and a p⁺-type region (hereinafter, p⁺-type partial region) 91 are selectively formed in a surface layer of the n⁻-type silicon carbide layer 71. The p⁺-type partial region 91 is a portion of the second p⁺-type region 62a in the effective region 1a of the active region 1 and is a portion of the second p⁺-type regions 62b, 62c in the high-function region 3.

In the effective region 1a of the active region 1, the first p⁺-type region 61a and the p⁺-type partial region 91 are disposed to alternately repeat along a direction parallel to the front surface of the n⁺-type starting substrate 31. In the high-function region 3, the first p⁺-type region 61b and the p⁺-type partial region 91 are disposed to alternately repeat along a direction parallel to the front surface of the n⁺-type starting substrate 31. The p⁺-type partial region 91 that forms the second p$^+$-type region 62$c$ is formed in an entire portion of the high-function region 3 excluding, for example, a formation region of the current sensing portion 12.

A distance d12 between the first p$^+$-type region 61$a$ and the p$^+$-type partial region 91 that are adjacent to each other may be, for example, about 1.5 μm. A distance between the first p$^+$-type region 61$b$ and the p$^+$-type partial region 91 that are adjacent to each other may be, for example, about 1.5 μm. A depth d11 and impurity concentration of the first p$^+$-type regions 61$a$, 61 $b$ and the p$^+$-type partial region 91 may be, for example, about 0.5 μm and about 5.0×10$^{18}$/cm$^3$, respectively.

Next, by photolithography and ion implantation of an n-type impurity, for example, nitrogen, in the effective region 1$a$ of the active region 1 and in the high-function region 3, an n-type region (hereinafter, n-type partial region) 92 is formed in a surface layer of the n$^-$-type silicon carbide layer 71. The n-type partial region 92 is a portion of the n-type current spreading region 33$a$ in the effective region 1$a$ of the active region 1 and is a portion of the n-type current spreading region 33$b$ in the high-function region 3.

An impurity concentration of the n-type partial region 92 may be, for example, about 1.0×10$^{17}$/cm$^3$. A portion of the n$^-$-type silicon carbide layer 71 closer to the drain side than is the n-type partial region 92 forms the n$^-$-type drift region 32. Here, by variously changing a depth d13 of the n-type partial region 92 relative to the depth d11 of the first p$^+$-type regions 61$a$, 61 $b$ and the p$^+$-type partial region 91, depths of ends of the second p$^+$-type regions 62$a$ to 62$c$ on the drain side (the depths relative to the n-type current spreading regions 33$a$, 33$b$) are determined.

For example, when the ends of the second p$^+$-type regions 62$a$ to 62$c$ nearest the drain side terminate closer to the drain side than do the n-type current spreading regions 33$a$, 33$b$, a depth of the n-type partial region 92 suffices to be shallower than the first p$^+$-type regions 61$a$, 61 $b$ and the p$^+$-type partial region 91. In this case, the depth of the n-type partial region 92 may be, for example, about 0.4 μm. A sequence in which the n-type partial region 92, the first p$^+$-type regions 61$a$, 61$b$, and the p$^+$-type partial region 91 are formed may be interchanged.

Figure 5:
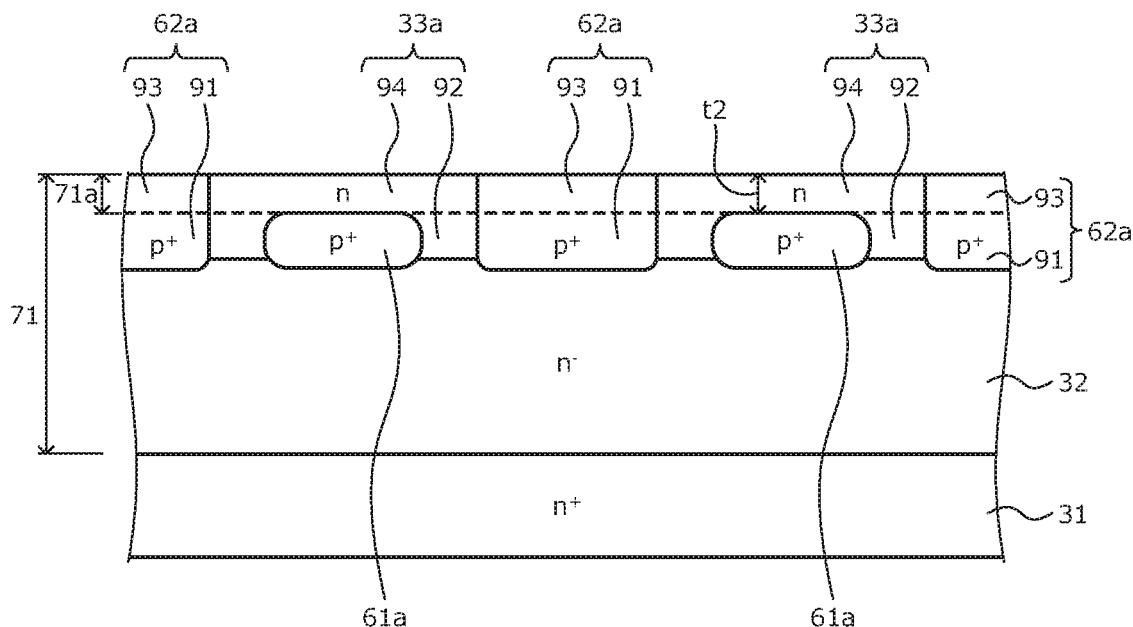
FIG. 5 is a cross-sectional view of the semiconductor device according to the first embodiment during manufacture.

Next, as depicted in FIG. 5, an n$^-$-type silicon carbide layer doped with an n-type impurity, for example, nitrogen is further formed on the n$^-$-type silicon carbide layer 71 by epitaxial growth to have a thickness t2 of, for example, 0.5 μm, whereby a thickness of the n$^-$-type silicon carbide layer 71 is increased. An impurity concentration of the n$^-$-type silicon carbide layer 71 may be, for example, uniform in the depth direction from a portion (surface layer of the n$^-$-type silicon carbide layer 71) 71$a$ that increases the thickness of the n$^-$-type silicon carbide layer 71 to a border of the n$^+$-type starting substrate 31, and may be about 3.0×10$^{15}$/cm$^3$.

Next, by photolithography and ion implantation of a p-type impurity such as aluminum, at a portion of the portion 71$a$ that increases the thickness of the n$^-$-type silicon carbide layer 71, at the portion that faces the p$^+$-type partial region 91 in the depth direction, a p$^+$-type partial region 93 is selectively formed at a depth reaching the p$^+$-type partial region 91. A width and an impurity concentration of the p$^+$-type partial region 93 are, for example, substantially equal to those of the p$^+$-type partial region 91. The p$^+$-type partial regions 91, 93 are connected in the depth direction and thereby, form the second p$^+$-type regions 62$a$ to 62$c$.

Next, by photolithography and ion implantation of an n-type impurity, for example, nitrogen, for example, spanning the active region overall, in the portion 71$a$ that increases the thickness of the n$^-$-type silicon carbide layer 71, an n-type partial region 94 is formed at a depth reaching the n-type partial region 92. An impurity concentration of the n-type partial region 94 is substantially equal to that of the n-type partial region 92. The n-type partial regions 92, 94 are connected in the depth direction and thereby, form the n-type current spreading regions 33$a$, 33$b$. A sequence in which the p$^+$-type partial region 93 and the n-type partial region 94 are formed may be interchanged.

Figure 6:
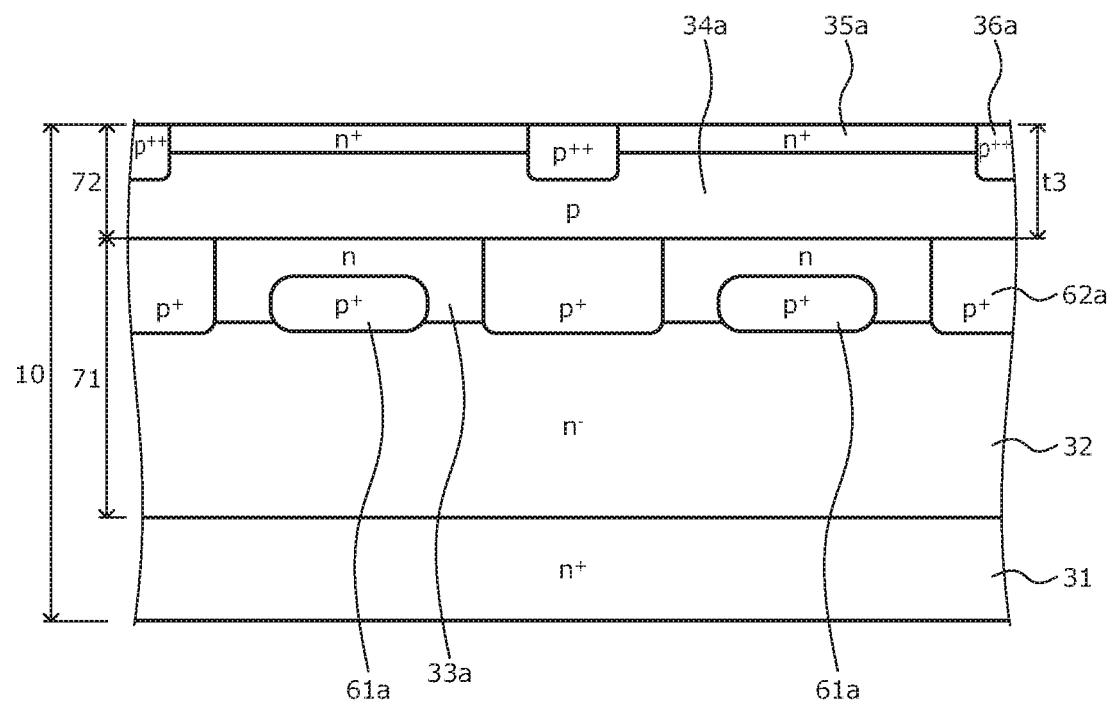
FIG. 6 is a cross-sectional view of the semiconductor device according to the first embodiment during manufacture.

Next, as depicted in FIG. 6, on the n$^-$-type silicon carbide layer 71, the p-type silicon carbide layer 72 doped with a p-type impurity, for example, aluminum is formed by epitaxial growth. A thickness t3 and an impurity concentration of the p-type silicon carbide layer 72 may be, for example, about 1.3 μm and about 4.0×10$^{17}$/cm$^3$, respectively. As a result, the semiconductor substrate (semiconductor wafer) 10 in which the n$^-$-type silicon carbide layer 71 and the p-type silicon carbide layer 72 are sequentially stacked on the n$^+$-type starting substrate 31 is formed.

Next, by photolithography and ion implantation of an n-type impurity, for example, phosphorus (P), the n$^+$-type source region 35$a$ of the main semiconductor element 11 and the n$^+$-type source region 35$b$ of the current sensing portion 12 are selectively formed in a surface layer of the p-type silicon carbide layer 72. Next, by photolithography and ion implantation of a p-type impurity such as aluminum, the n$^+$-type source regions 35$a$, 35$b$ are formed in the surface layer of the p-type silicon carbide layer 72, whereby the p$^{++}$-type contact regions 36$a$, 36$b$ are selectively formed.

Next, by photolithography and ion implantation of an n-type impurity, for example, phosphorus, the n$^-$-type region 32$a$ is formed to penetrate the p-type silicon carbide layer 72 in the depth direction Z to reach the n$^-$-type silicon carbide layer 71. A sequence in which the n$^+$-type source regions 35$a$, 35$b$, the p$^{++}$ type contact regions 36$a$, 36$b$, and the n$^-$-type region 32$a$ are formed may be interchanged. A portion of the p-type silicon carbide layer 72 other than the n$^+$-type source regions 35$a$, 35$b$, the p$^{++}$-type contact regions 36$a$, 36$b$, and the n$^-$-type region 32$a$ forms the p-type base regions 34$a$, 34$b$.

In the ion implantations described above, for example, a resist film or an oxide film may be used as an ion implantation mask. Further, diffusion regions (e.g., the spreading diode, for example, forming the over-voltage protecting portion 14, a complementary MOS (CMOS) configuring the calculating circuit portion, etc.) for all the elements disposed in the semiconductor substrate 10 other than the main semiconductor element 11 and the current sensing portion 12 described above are formed before activation annealing described hereinafter. Of all the elements disposed in the semiconductor substrate 10, regions having a same conductivity type, a same impurity concentration, and a same diffusion depth are formed concurrently.

Next, for all the diffusion regions (the first p$^+$-type regions 61$a$, 61 $b$, the second p$^+$-type regions 62$a$ to 62$c$, the n-type current spreading regions 33$a$, 33$b$, the n$^+$-type source regions 35$a$, 35$b$, the p$^{++}$-type contact regions 36$a$, 36$b$, and the n$^-$-type region 32$a$) formed by ion implantation, a heat treatment (activation annealing) for activating impurities is performed, for example, at a temperature of about 1700 degrees C. for about 2 minutes. The activation annealing may be performed in one session collectively after all of the diffusion regions have been formed, or may be performed each time a diffusion region is formed by ion implantation.

Figure 7:
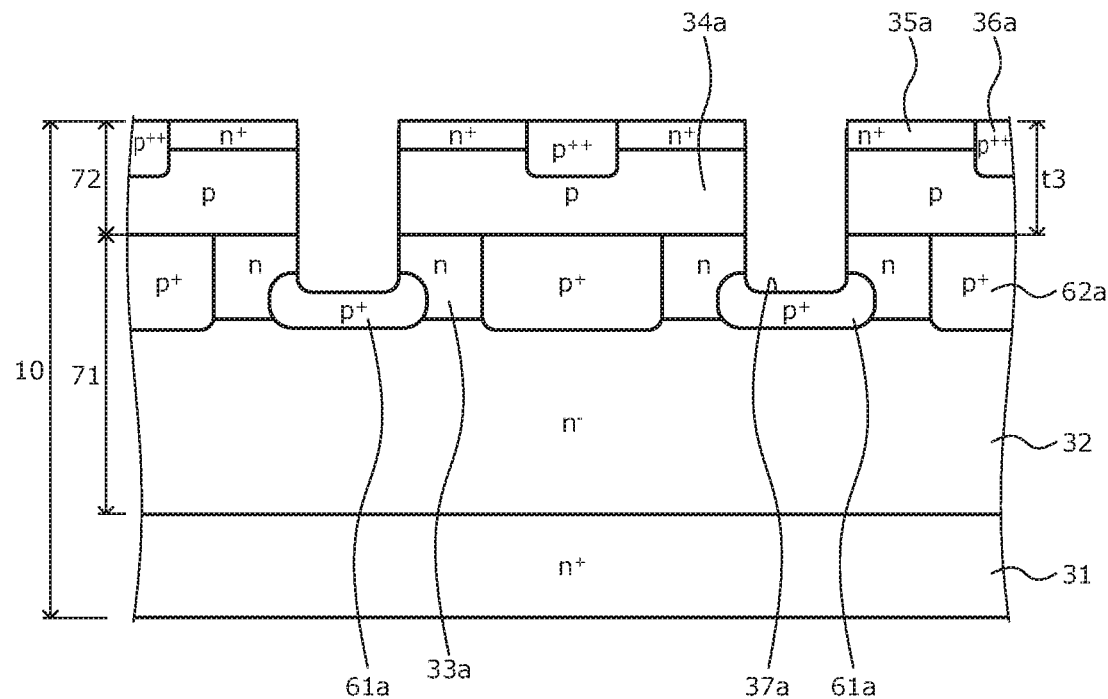
FIG. 7 is a cross-sectional view of the semiconductor device according to the first embodiment during manufacture.

Next, as depicted in FIG. 7, by photolithography and etching, in the effective region 1$a$ of the active region 1, the trench 37$a$ is formed to penetrate the n$^+$-type source region 35a and the p-type base region 34a of the main semiconductor element 11 to reach the first $p^+$-type region 61a in the n-type current spreading region 33a. In the high-function region 3, the trench 37b is formed to penetrate the $n^+$-type source region 35b and the p-type base region 34b of the current sensing portion 12 to reach the first $p^+$-type region 61b in the n-type current spreading region 33b.

The trenches 37a, 37b, when viewed from the front surface side of the semiconductor substrate 10, for example, may be disposed in a striped layout extending along a direction parallel to the front surface of the semiconductor substrate 10, or maybe disposed in a matrix-like layout. The trenches 37a, 37b, when viewed from the front surface side of the semiconductor substrate 10, may be disposed in similar layouts, or may be disposed in differing layouts. For example, a resist film or an oxide film may be used as an etching mask for forming the trenches 37a, 37b.

Figure 8:
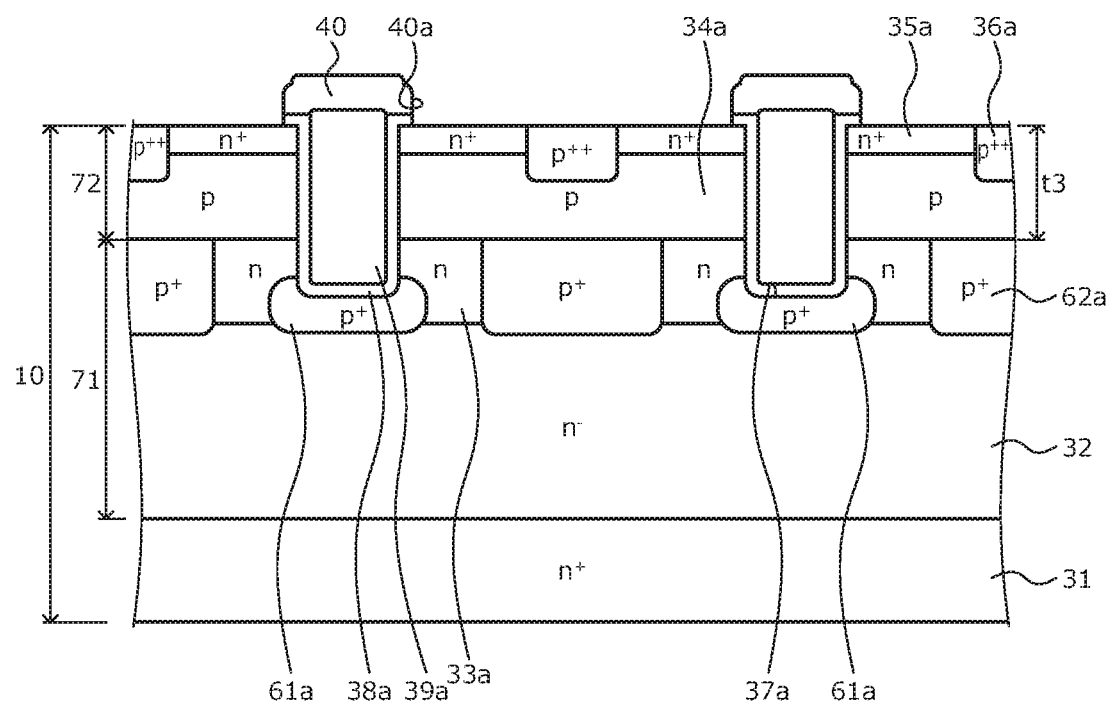
FIG. 8 is a cross-sectional view of the semiconductor device according to the first embodiment during manufacture.

Next, as depicted in FIG. 8, along a surface (i.e., surfaces of the $n^+$-type source regions 35a, 35b and the $p^{++}$-type contact regions 36a, 36b) of the semiconductor substrate 10 and inner walls of the trenches 37a, 37b, an oxide film that forms the gate insulating films 38a, 38b is formed. The gate insulating films 38a, 38b may be formed by, for example, thermal oxidation of the surface of the semiconductor substrate 10 and the inner walls of the trenches 37a, 37b by a heat treatment process in an oxygen ($O_2$) atmosphere at a temperature of about 1000 degrees C. Further, the gate insulating films 38a, 38b may be a film deposited by a chemical reaction for a high temperature oxide (HTO).

Next, a poly-silicon (poly-Si) layer doped with, for example, phosphorus is deposited on the gate insulating films 38a, 38b so as to be embedded in the trenches 37a, 37b. Further, the poly-silicon layer is patterned so that portions that form the gate electrodes 39a, 39b are left in the trenches 37a, 37b. Here, the poly-silicon layer may be left so as to protrude out from the front surface of the semiconductor substrate 10 or the poly-silicon layer may be etched by etchback so as to be left deeper than the substrate front surface.

Next, the interlayer insulating film 40 is formed at the front surface of the semiconductor substrate 10 overall to have, for example, a thickness of about 1 µm and to cover the gate insulating films 38a, 38b and the gate electrodes 39a, 39b. The interlayer insulating film 40 may be, for example, a phosphosilicate glass (PSG). Next, the interlayer insulating film 40 and the gate insulating films 38a, 38b are patterned, thereby forming the contact holes 40a, 40b and exposing the $n^+$-type source regions 35a, 35b and the $p^{++}$ type contact regions 36a, 36b.

Next, by a heat treatment (reflow), the interlayer insulating film 40 is planarized. Next, after the first TiN film 42a is formed so to cover the interlayer insulating film 40, the first TiN film 42a is partially removed by photolithography and etching so that a portion that remains covers a portion of the interlayer insulating film 40. Here, the first TiN film 42a is partially removed so that a portion of the first TiN film 42a in contact with the front surface of the semiconductor substrate 10 does not remain. For example, the first TiN film 42a is left only on a top surface so as to cover the interlayer insulating film 40 entirely.

Next, for example, by sputtering, a Ni film is formed on the interlayer insulating film 40 and the first TiN film 42a from bottoms of the contact holes 40a, 40b. For example, by sputtering, a Ni film is formed at the rear surface of the semiconductor substrate 10 overall. Next, by a heat treatment, Si atoms in the semiconductor substrate 10 and Ni atoms in the Ni film are reacted with each other to convert the Ni film into a silicide, whereby the NiSi films 41a, 41b that form the source pad 21a and the OC pad 22 are formed, and a NiSi film that forms the drain electrode 51 is formed.

When the source pad 21a and the OC pad 22 are formed by TiSi films instead of the NiSi films 41a, 41b, a Ti film is formed at the front surface of the semiconductor substrate 10 instead of a Ni film that is an electrode material, and a portion of the Ti film on the bottoms of the contact holes 40a, 40b is converted into a silicide by a reaction with the semiconductor substrate 10. When the drain electrode 51 is a TiSi film, a Ti film is formed at the rear surface of the semiconductor substrate 10 instead of the Ni film that is an electrode material, and the Ni film is converted into a silicide by a reaction with the semiconductor substrate 10.

Next, by photolithography and etching, a portion of the Ni film other than the NiSi films 41a, 41b is removed. Next, for example, the first Ti films 43a, 43b, the second TiN films 44a, 44b, and the second Ti films 45a, 45b are sequentially stacked by sputtering, along the front surface of the semiconductor substrate 10. Next, for example, by sputtering, the Al alloy films 46a, 46b are formed on the second Ti films 45a, 45b so as to be embedded in the contact holes 40a, 40b. A thickness of the Al alloy films 46a, 46b may be, for example, about 5 µm.

Next, by photolithography and etching, the metal film on the front surface of the semiconductor substrate 10 is patterned to leave portions that form the source pad 21a and the OC pad 22. As a result, the source pad 21a that includes the NiSi film 41a, the first TiN film 42a, the first Ti film 43a, the second TiN film 44a, the second Ti film 45a, and the Al alloy film 46a is formed. The OC pad 22 that includes the NiSi film 41b, the first TiN film 42b, the first Ti film 43b, the second TiN film 44b, the second Ti film 45b, and the Al alloy film 46b is formed.

The gate pad 21b and the OV pad 24 of the over-voltage protecting portion 14 may be formed together with the source pad 21a and the OC pad 22, and may have a same layered structure as the source pad 21a and the OC pad 22. Further, before formation of the source pad 21a and the OC pad 22, the p-type poly-silicon layer 81, the n-type poly-silicon layer 82, the interlayer insulating film 83, the anode electrode 84, and the cathode electrode 85 that configure the temperature sensing portion 13 are formed on the field insulating film 80 in the high-function region 3 by a general method.

The p-type poly-silicon layer 81 and the n-type poly-silicon layer 82 of the temperature sensing portion 13, for example, may be formed concurrently with the main semiconductor element 11 and the gate electrodes 39a, 39b of the current sensing portion 12. The field insulating film 80 may be a portion of the interlayer insulating film 40 of the current sensing portion 12 and the main semiconductor element 11. In this case, the p-type poly-silicon layer 81 and the n-type poly-silicon layer 82 of the temperature sensing portion 13 are formed after the formation of the interlayer insulating film 40 of the current sensing portion 12 and the main semiconductor element 11.

Next, the anode pad 23a and the cathode pad 23b are formed to be in contact with the anode electrode 84 and the cathode electrode 85, respectively. The anode pad 23a and the cathode pad 23b may be formed together with the source pad 21a and the OC pad 22, and may have a same structure as the source pad 21a and the OC pad 22. Next, for example, by sputtering, on a surface of the drain electrode 51, for example, a Ti film, a Ni film, and a gold (Au) film are sequentially stacked, whereby the drain pad 52 is formed.

Next, a polyimide film is formed so as to cover the electrode pads (the source pad 21a, the gate pad 21b, the OC pad 22, the anode pad 23a, the cathode pad 23b, and the OV pad 24). Next, by photolithography and etching, the polyimide film is selectively removed to form the first protective films 49a to 49c that cover the electrode pads, respectively, and to form openings in the first protective films 49a to 49c. In FIG. 2, the gate pad 21b and the OV pad 24, the first and the second protective films of the OV pad 24 and the gate pad 21b, and the plating film and the terminal pin are not depicted.

Next, by general plating preprocessing, portions of the electrode pads 21a, 21b, 22, 23a, 23b, 24 exposed in the openings of the first protective films 49a to 49d are cleaned to a state suitable for plating. Next, by a plating process, the plating films 47a to 47d are formed at the portions of the electrode pads 21a, 21 b, 22, 23a, 23b, 24 exposed in the openings of the first protective films 49a to 49d. Here, the first protective films 49a to 49d function as masks to suppress wet spreading of the plating films 47a to 47d. A thickness of the plating films 47a to 47d may be, for example, about 5 μm.

Next, the second protective films 50a to 50d are formed to cover borders between the plating films 47a to 47d and the first protective films 49a to 49d. Next, the terminal pins 48a to 48d are bonded on the plating films 47a to 47d by the solder layers 53a to 53d, respectively. Here, the second protective films 50a to 50d function as masks that suppress wet spreading of the solder layers 53a to 53d. Thereafter, the semiconductor wafer is diced (cut) into individual chips, whereby the semiconductor device depicted in FIGS. 1, 2 is completed.

As described above, according to the first embodiment, in the high-function region, the electrode pads of the circuit portions for protecting/controlling the main semiconductor element are disposed separated from the edge termination region. Additionally, between the edge termination region and the electrode pads of the circuit portions, the p-type region that is fixed at the electric potential of the source pad and the lead-out electrode are disposed. As a result, when the main semiconductor element is OFF, displacement current that flows into the active region from the edge termination region may be lead out from the lead-out electrode, via the p-type region that is fixed at the electric potential of the source pad. As a result, a concentration of displacement current at the border between the edge termination region and the high-function region may be suppressed, whereby destruction of an element of the edge termination region near the border of the high-function region is suppressed.

Figure 9:
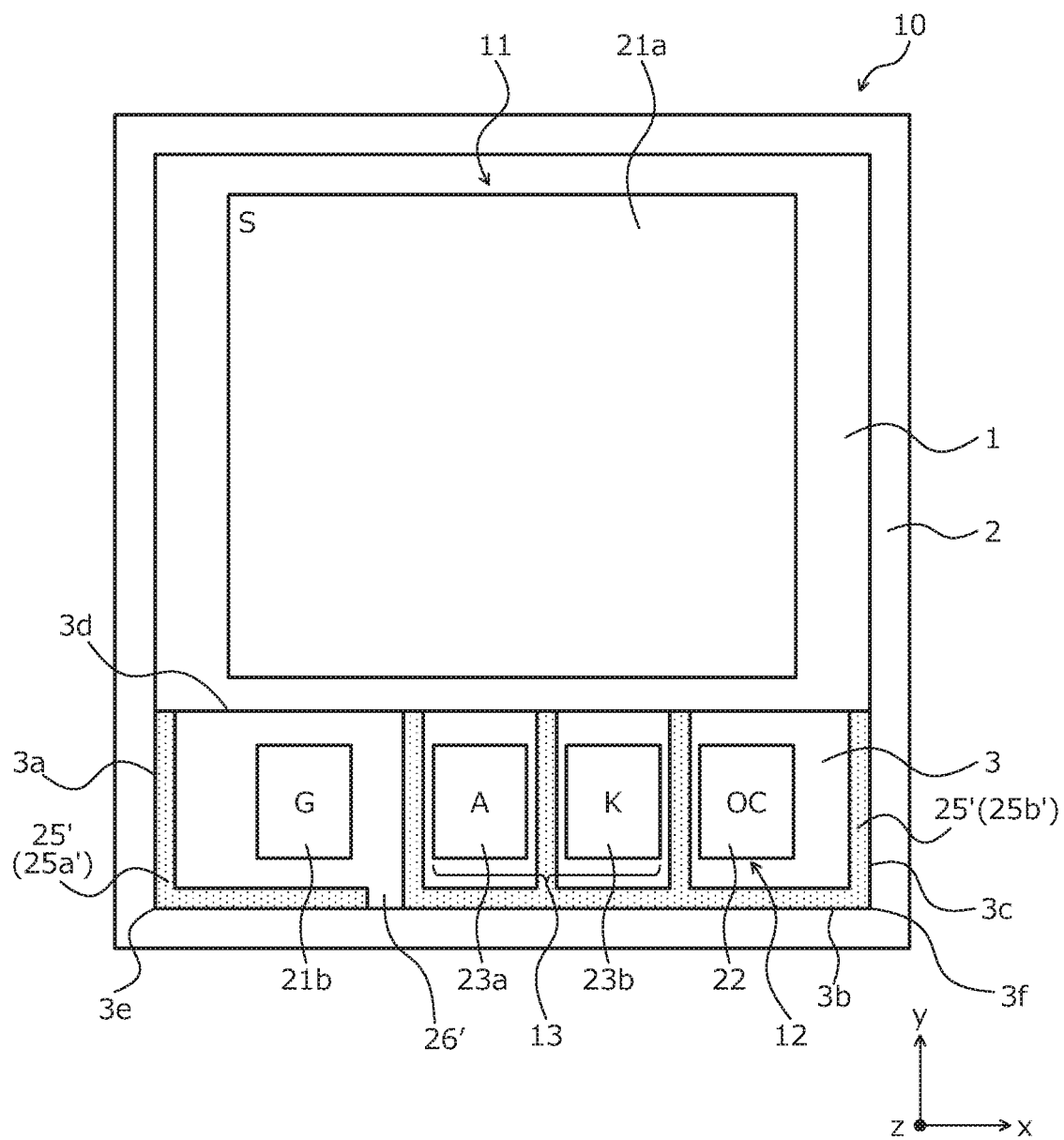
FIG. 9 is a plan view of a layout when the semiconductor device according to a second embodiment is viewed from the front surface side of the semiconductor substrate.

A structure of the semiconductor device according to a second embodiment will be described. FIG. 9 is a plan view of a layout when the semiconductor device according to the second embodiment is viewed from the front surface side of the semiconductor substrate. The semiconductor device according to the second embodiment differs from the semiconductor device according to the first embodiment in that a lead-out electrode 25' (hatched portion) is further disposed between the electrode pads 21b, 22, 23a, 23b, and 24 that are disposed in the high-function region 3. In FIG. 9, while the OV pad is not depicted, the OV pad is disposed in the high-function region 3 similarly to the first embodiment, and the lead-out electrode 25' is disposed between the OV pad and the other electrode pads.

In particular, in the high-function region 3, for example, two of the lead-out electrodes 25' (25a', 25b') are provided separated from each other to sandwich the gate contact metal region 26' therebetween. In this case, for example, similarly to the first embodiment, the high-function region 3 has a substantially rectangular planar shape and of three sides 3a to 3c thereof forming borders with the edge termination region 2, the lead-out electrode 25a' is provided in a substantially L-shaped planar shape along the two sides 3a, 3b having the vertex 3e in common. The lead-out electrode 25a' faces two sides of the gate pad 21b having a vertex thereof in common.

The lead-out electrode 25b' has a substantially comb-like planar shape that has a substantially L-shape portion along the two sides 3b, 3c having the vertex 3f of the high-function region 3 in common and linear portions that extend in substantially straight lines between the electrode pads 22, 23a, 23b, from the substantially L-shaped portion. The lead-out electrode 25b', for example, is disposed between the gate pad 21b and the anode pad 23a, between the anode pad 23a and the cathode pad 23b, and between the cathode pad 23b and the OC pad 22.

As described above, according to the second embodiment, the lead-out electrode is disposed between the electrode pads of the high-function region, whereby dv/dt surge capability may be enhanced and effects similar to those of the first embodiment may be obtained.

Figure 10:
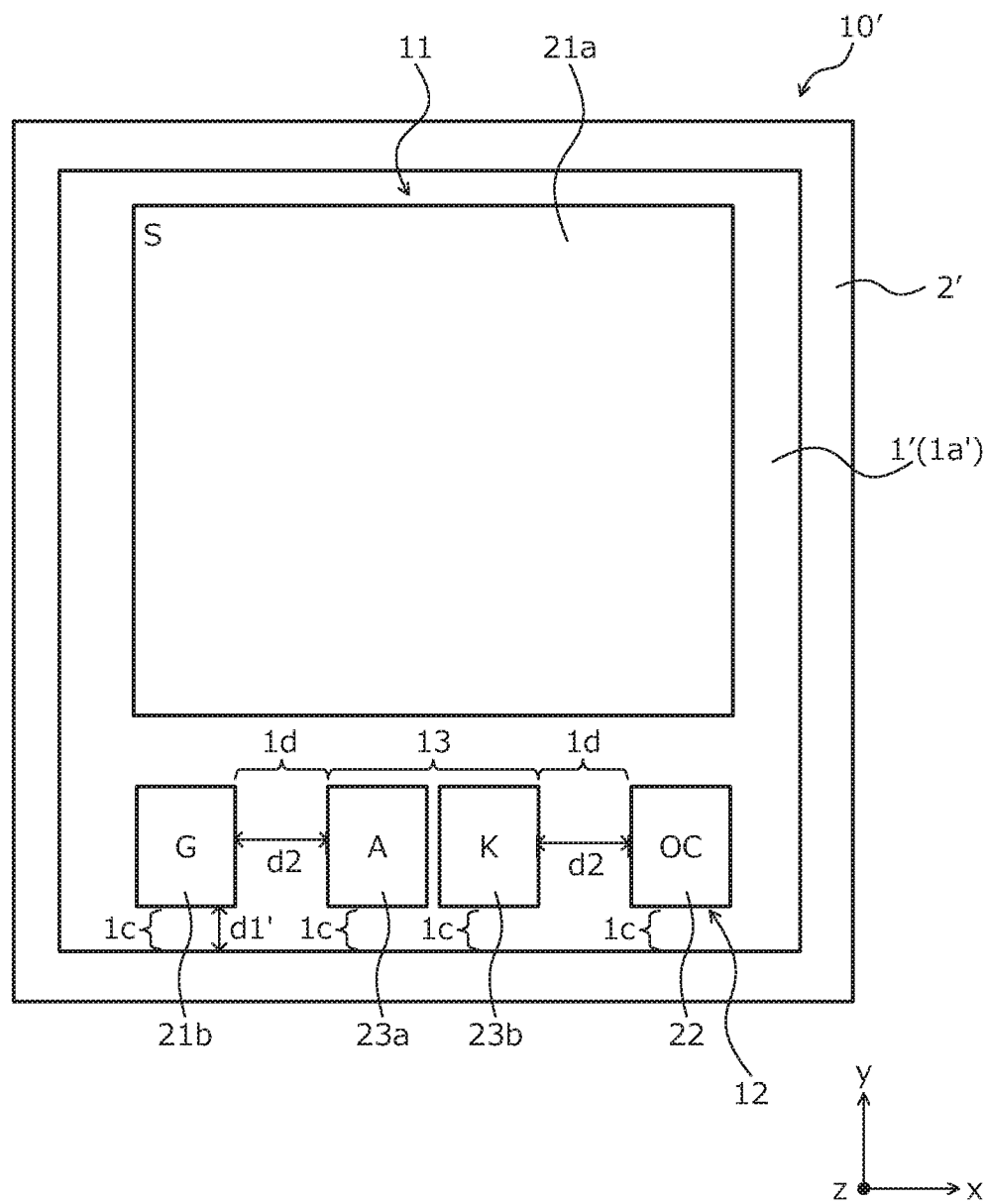
FIG. 10 is a plan view of a layout when the semiconductor device according to a third embodiment is viewed from the front surface side of the semiconductor substrate.

A structure of the semiconductor device according to a third embodiment will be described. FIG. 10 is a plan view of a layout when the semiconductor device according to the third embodiment is viewed from the front surface side of the semiconductor substrate. The semiconductor device according to the third embodiment differs from the semiconductor device according to the first embodiment in that all of the electrode pads 21a, 21 b, 22, 23a, 23b are disposed in an effective region 1a' of an active region 1', and main current of the main semiconductor element 11 flows in a portion of the active region 1' directly beneath the electrode pads 21a, 21b, 22, 23a, 23b. In the third embodiment, no lead-out electrode is provided. In FIG. 10, while the OV pad is not depicted, the OV pad is also disposed in the effective region 1a' of the active region 1'.

The p-type base region 34a (refer to FIG. 2) of the main semiconductor element 11 and the p-type base region 34b (refer to FIG. 2) directly beneath the electrode pads 21b, 22, 23a, 23b are separated from each other, similarly to the first embodiment. The unit cell of the main semiconductor element 11 is disposed between the electrode pads 21b, 22, 23a, 23b, and between an edge termination region 2' and the electrode pads 21b, 22, 23a, 23b. Displacement current that flows into the active region 1' from the edge termination region 2' when the main semiconductor element 11 is OFF is lead out by a unit cell of the main semiconductor element 11 disposed near the electrode pads 21b, 22, 23a, 23b.

In particular, the gate pad 21b, the OC pad 22, the anode pad 23a, and the cathode pad 23b are disposed in parallel on a same straight line along one side of the active region 1' that has a substantially rectangular planar shape, for example. A space 1c between the edge termination region 2' and the gate pad 21b, the OC pad 22, the anode pad 23a, and the cathode pad 23b, similarly to the first embodiment, separates the edge termination region 2' and the gate pad 21b, the OC pad 22, the anode pad 23a, and the cathode pad 23b by an interval d1' that is at least equivalent to the width of one unit cell of the main semiconductor element 11.

A space 1d between the gate pad 21b and the temperature sensing portion 13 (e.g., the anode pad 23a), and between the OC pad 22 and the temperature sensing portion 13 (e.g., the cathode pad 23b) separates the gate pad 21b and the temperature sensing portion 13 (e.g., the anode pad 23a), and separates the OC pad 22 and the temperature sensing portion 13 by an interval d2 that is at least equivalent to the width of one unit cell of the main semiconductor element 11. In the space 1c between the edge termination region 2' and the electrode pads 21b, 22, 23a, 23b, and in the space 1d between the temperature sensing portion 13 and the electrode pads 21b, 22, a unit cell of the main semiconductor element 11 is disposed.

As described above, according to the third embodiment, displacement current that flows into the active region from the edge termination region when the main semiconductor element is OFF is lead out by the unit cells of the main semiconductor element disposed between the edge termination region and the electrode pads, and between the electrode pads. Therefore, effects similar to those of the first and the second embodiments may be obtained. Further, according to the third embodiment, the main semiconductor element may be disposed between adjacent electrode pads, thereby enabling current capacitance of the main semiconductor element to be increased.

In the foregoing, various modifications are possible within a range not departing from the spirit of the invention. In the described embodiments, for example, dimensions and impurity concentrations of regions, etc. may be variously set according to required specifications. Further, the present invention is not limited to a trench gate MOSFET and is further applicable to a planar gate MOSFET. Additionally, in the described embodiments, while a case in which plural circuit portions for protecting/controlling the main semiconductor element are disposed is described as an example, effects of the present invention are obtained when one or more circuit portions for protecting/controlling the main semiconductor element are provided.

Further, in the described embodiments, while the epitaxial substrate in which a silicon carbide layer is formed on the starting substrate by epitaxial growth is formed, without limitation to here, in a semiconductor substrate containing silicon carbide, regions configuring the semiconductor device may be formed, for example, by ion implantation. Further, the present invention is applicable to wide bandgap semiconductor materials (e.g., gallium (Ga), etc.) other than silicon carbide. The present invention is similarly implemented when conductivity types (n-type, p-type) are reversed.

According to the described embodiments of the invention, displacement current may be suppressed from concentrating at the border between the edge termination region and the electrode pad of one or more circuit portions for protecting or controlling a first insulated gate field effect transistor.

The semiconductor device according to the present invention achieves an effect in that destruction at the edge termination region may be suppressed.

As described, the semiconductor device according to the present invention is useful for MOS semiconductor devices having a double-sided cooling structure and is particularly suitable for semiconductor devices having an edge termination region of a narrow width.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first-conductivity-type, containing a semiconductor material having a bandgap wider than a bandgap of silicon, the semiconductor substrate having a first main surface and a second main surface opposite to the first main surface, and including an active region in which a main current flows, and a termination region surrounding a periphery of the active region in a plan view of the device;
   a first second-conductivity-type region of a second-conductivity-type, provided in a surface layer at a first main surface side of the semiconductor substrate in the active region;
   a second second-conductivity-type region of the second-conductivity-type, provided in the surface layer at the first main surface side of the semiconductor substrate in the active region, and being separated from the first second-conductivity-type region;
   a first insulated gate field effect transistor including the first second-conductivity-type region as a base region, the first insulated gate field effect transistor having a source pad that is electrically connected to the first second-conductivity-type region;
   one or more circuits for protecting or controlling the first insulated gate field effect transistor, provided in the second second-conductivity-type region; and
   one or more electrode pads provided on the first main surface of the semiconductor substrate and being separated from the termination region, the one or more electrode pads being disposed on a corresponding one of the one or more circuits, wherein
   the second second-conductivity-type region is provided between the termination region and the electrode pads, and has a fixed electric potential that is the same as an electric potential of the source pad.

2. The semiconductor device according to claim 1, further comprising
   a first electrode that is different from any of the one or more electrode pads, having a fixed electric potential that is the same as an electric potential of the source pad, and being provided on the first main surface of the semiconductor substrate, the first electrode being provided between the termination region and the one or more electrode pads, the first electrode being separated from the one or more electrode pads, wherein
   the second second-conductivity-type region is set to have the electric potential of the source pad via the first electrode.

3. The semiconductor device according to claim 2, wherein
   the one or more electrode pads include a plurality of electrode pads, and
   the second second-conductivity-type region and the first electrode are provided between two electrode pads that are adjacent to each other of the plurality of electrode pads.

4. The semiconductor device according to claim 1, further comprising
   a high-function region in which the one or more circuits and the electrode pads are disposed, the high-function region being provided in the active region and adjacent to the termination region, wherein
   the second second-conductivity-type region is provided in the surface layer at the first main surface side of the semiconductor substrate over all of the high-function region.

5. The semiconductor device according to claim 4, wherein
   the first insulated gate field effect transistor includes:
   the first second-conductivity-type region, a first-conductivity-type region that is a portion of the semiconductor substrate other than the first second-conductivity-type region and the second second-conductivity-type region, a first trench penetrating the first second-conductivity-type region in a depth direction and reaching the first-conductivity-type region, a first gate insulating film provided on an inner surface of the first trench, a first gate electrode provided in the first trench on the first gate insulating film, the source pad, the source pad being electrically connected to the first-conductivity-type region and the first second-conductivity-type region, and a second electrode provided on the second main surface of the semiconductor substrate, the semiconductor device further comprising:

a second trench penetrating the second second-conductivity-type region in the depth direction and reaching the first-conductivity-type region;

a second gate insulating film provided on an inner surface of the second trench; and a second gate electrode provided in the second trench on the second gate insulating film, wherein the second trench, the second gate insulating film, and the second gate electrode have configurations identical to configurations of the first trench, the first gate insulating film, and the first gate electrode, respectively.

6. The semiconductor device according to claim 1, wherein the one or more electrode pads include a plurality of electrode pads, and the first second-conductivity-type region is provided between two of the electrode pads that are adjacent to each other.

7. The semiconductor device according to claim 1, wherein the one of the one or more circuits is a second insulated gate field effect transistor that detects overcurrent flowing in the first insulated gate field effect transistor, and has a configuration identical a configuration of the first insulated gate field effect transistor.

8. The semiconductor device according to claim 1, wherein one of the one or more circuits is a diode that detects a temperature of the first insulated gate field effect transistor.

9. The semiconductor device according to claim 1, wherein one of the one or more circuits is a diode that protects the first insulated gate field effect transistor from overvoltage.

10. The semiconductor device according to claim 1, wherein the one or more circuits each constitute a semiconductor element, and the second second-conductivity-type region is provided as a base region for each semiconductor element.

11. The semiconductor device according to claim 1, wherein the second second-conductivity-type region is not electrically connected to the source pad of the insulated gate field effect transistor.

12. The semiconductor device according to claim 1, further comprising a contact region of the second-conductivity-type, provided in a surface layer of the second second-conductivity-type region, wherein one of the one or more circuits constitutes a second insulated gate field effect transistor together with the contact region and the second second-conductivity-type region, the second second-conductivity-type region being provided as a base region of the second insulated gate field effect transistor, and being not electrically connected to the source pad of the insulated gate field effect transistor.

13. The semiconductor device according to claim 1, further comprising a contact region of the second-conductivity-type, provided in a surface layer of the second second-conductivity-type region, wherein one of the one or more circuits constitutes a diode, together with the contact region and the second second-conductivity-type region, the second second-conductivity-type region being provided as a base region of the diode, and being not electrically connected to the source pad of the insulated gate field effect transistor.

14. The semiconductor device according to claim 1, wherein the second second-conductivity-type region is provided adjacent to the edge termination region.

15. The semiconductor device according to claim 2, wherein the first electrode is provided between the termination region and each of the one or more electrode pads.

* * * * *